(12) United States Patent
Hack et al.

(10) Patent No.: US 10,514,136 B2
(45) Date of Patent: Dec. 24, 2019

(54) LIGHTING DEVICES

(71) Applicant: Universal Display Corporation, Ewing, NJ (US)

(72) Inventors: Michael Hack, Princeton, NJ (US); Ruiqing Ma, Morristown, NJ (US); Huiqing Pang, Newton, PA (US)

(73) Assignee: Universal Display Corporation, Ewing, NJ (US)

( * ) Notice: Subject to any disclaimer, the term of this patent is extended or adjusted under 35 U.S.C. 154(b) by 640 days.

(21) Appl. No.: 13/850,028

(22) Filed: Mar. 25, 2013

(65) Prior Publication Data

US 2014/0286008 A1  Sep. 25, 2014

(51) Int. Cl.
| | |
|---|---|
| *F21Y 115/15* | (2016.01) |
| *F21K 9/90* | (2016.01) |
| *F21S 6/00* | (2006.01) |
| *F21V 23/04* | (2006.01) |
| *H05B 33/08* | (2006.01) |
| *H01L 51/50* | (2006.01) |
| *F21Y 105/00* | (2016.01) |

(52) U.S. Cl.
CPC .............. *F21K 9/90* (2013.01); *F21S 6/00* (2013.01); *F21V 23/0485* (2013.01); *H05B 33/0896* (2013.01); *F21Y 2105/00* (2013.01); *F21Y 2115/15* (2016.08); *H01L 51/5016* (2013.01); *Y10T 29/49002* (2015.01)

(58) Field of Classification Search
CPC ........... G02F 1/133604; F21Y 2101/02; F21Y 2115/10; F21V 9/16; F21V 29/004; F21V 14/003; F21V 23/0485; F21K 9/00; H01L 2251/5338; H01L 2251/5361; H01L 25/048; H01L 51/5016; H05B 33/0896; G02B 6/0071; G02B 6/0046
USPC ..................... 362/84, 614, 249.02
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |

(Continued)

FOREIGN PATENT DOCUMENTS

| | | |
|---|---|---|
| WO | 2008057394 | 5/2008 |
| WO | 2010011390 | 1/2010 |
| WO | 2011146734 | 11/2011 |

OTHER PUBLICATIONS

Baldo, et al., "Highly Efficient Phosphorescent Emission fromOrganic Electroluminescent Devices," Nature, Sep. 10, 1998, 4 pp., Macmillan Publishers Ltd., London, UK.

(Continued)

*Primary Examiner* — Zheng Song
(74) *Attorney, Agent, or Firm* — Morris & Kamlay LLP

(57) ABSTRACT

A device includes a light emitting assembly including at least one light panel including one or more phosphorescent organic light emitting devices. The device may, for example, be a personal lighting device. The at least one light panel has a peak luminance less than 5,000 cd/m$^2$, an efficiency of greater than 30 lm/W, and a maximum surface temperature during illumination in ambient conditions of no greater than 40° C., At least a portion of the light emitting assembly is touch sensitive to provide control of the device.

24 Claims, 6 Drawing Sheets

(56) References Cited

U.S. PATENT DOCUMENTS

| | | | |
|---|---|---|---|
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 6,620,731 B1 | 9/2003 | Farnworth | |
| 6,885,157 B1 | 4/2005 | Cok | |
| 7,034,843 B2* | 4/2006 | Nair et al. | 345/589 |
| 7,091,941 B2* | 8/2006 | Arnold et al. | 345/83 |
| 7,161,313 B2* | 1/2007 | Piepgras | F21S 8/035 315/292 |
| 7,180,677 B2* | 2/2007 | Fujii et al. | 359/665 |
| 7,279,704 B2 | 10/2007 | Walters | |
| 7,304,634 B2 | 12/2007 | Albert | |
| 7,427,240 B2* | 9/2008 | Takeuchi | 473/319 |
| 7,431,968 B1 | 10/2008 | Shtein | |
| 7,566,996 B2* | 7/2009 | Altonen et al. | 307/119 |
| 7,814,652 B2 | 10/2010 | Bellew | |
| 7,968,146 B2 | 6/2011 | Wagner | |
| 8,049,732 B2* | 11/2011 | Hotelling | G06F 3/044 178/18.01 |
| 8,153,279 B2* | 4/2012 | Eum et al. | 428/690 |
| 8,268,928 B2* | 9/2012 | Oshima | C08J 5/18 525/89 |
| 8,541,933 B2* | 9/2013 | Chowdhury et al. | 313/46 |
| 8,564,001 B2* | 10/2013 | Hack et al. | 257/98 |
| 8,797,296 B2* | 8/2014 | Hsieh et al. | 345/175 |
| 8,820,923 B2* | 9/2014 | Harding et al. | 351/159.01 |
| 8,946,689 B2* | 2/2015 | So | 257/40 |
| 9,018,660 B2* | 4/2015 | Hack et al. | 257/98 |
| 9,058,769 B2* | 6/2015 | Bert et al. | |
| 2003/0230980 A1 | 12/2003 | Forrest | |
| 2004/0174116 A1 | 9/2004 | Lu | |
| 2005/0248299 A1* | 11/2005 | Chemel | H05B 37/029 315/312 |
| 2005/0274973 A1* | 12/2005 | Takahashi | B29C 45/14655 257/100 |
| 2011/0284899 A1* | 11/2011 | Hack | H01L 51/5016 257/98 |
| 2012/0091923 A1* | 4/2012 | Kastner-Jung | B60Q 3/745 315/360 |
| 2012/0161667 A1* | 6/2012 | Mason | F21V 23/0442 315/297 |
| 2012/0181933 A1 | 7/2012 | Ma | |
| 2012/0286298 A1 | 11/2012 | Pang | |
| 2012/0286651 A1 | 11/2012 | Levermore | |
| 2013/0000329 A1 | 1/2013 | Smith | |
| 2013/0241076 A1 | 9/2013 | Mandlik | |
| 2014/0104877 A1* | 4/2014 | An | G02B 6/0088 362/609 |

OTHER PUBLICATIONS

Baldo, et al., "Very high-efficiency green organic light-emitting devices based on electrophosphorescence," Applied Physics Letters, Jul. 5, 1999, 4 pp., vol. 75, No. 1, American Institute of Physics, Melville, NY, USA.

\* cited by examiner

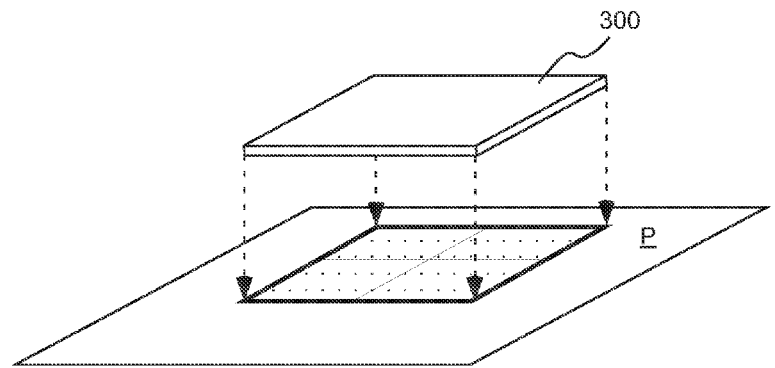
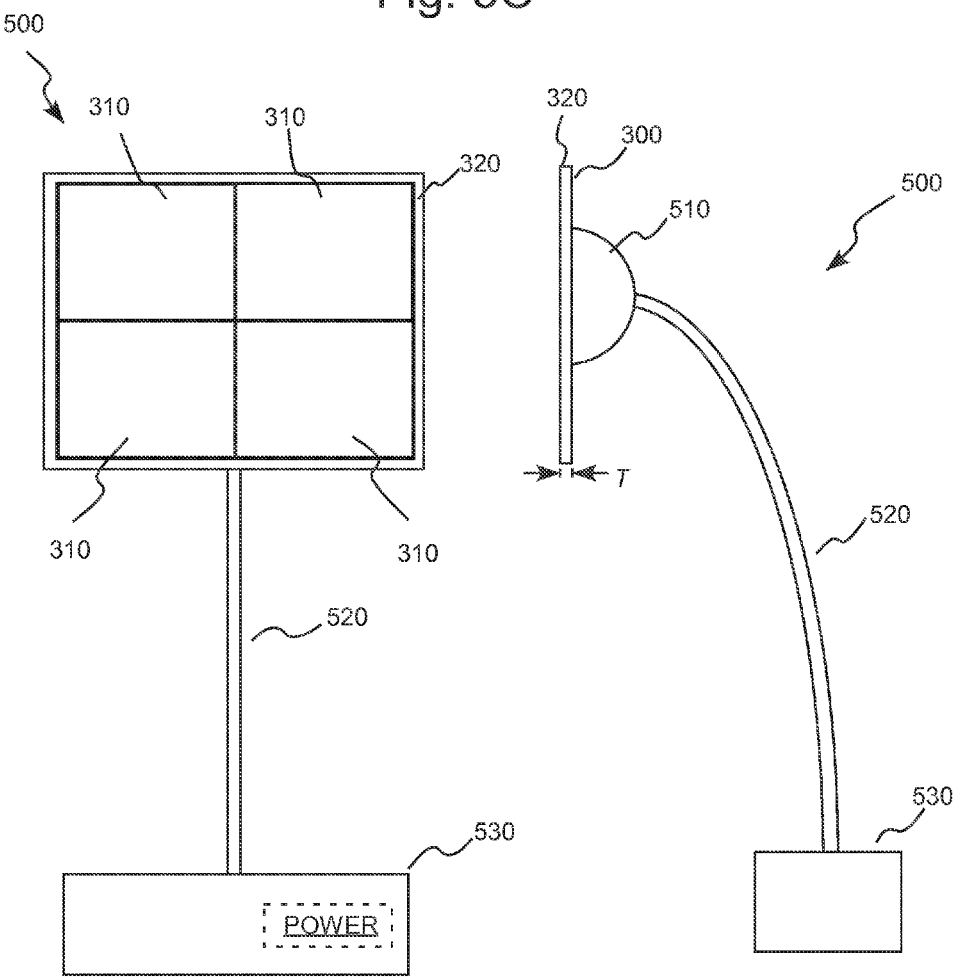
Fig. 5C
Fig. 5A
Fig. 5B

LIGHTING DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD

In a number of embodiments, devices, systems and methods hereof relate to light devices including organic light emitting devices.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies or the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

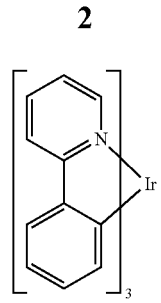

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

BRIEF SUMMARY

In one aspect, a device includes a light emitting assembly including at least one light panel having one or more phosphorescent organic light emitting devices. The device may, for example, be a personal lighting device. The at least one light panel has a peak luminance less than 5,000 $cd/m^2$, an efficiency of greater than 30 lm/W, and a maximum surface temperature during illumination in ambient conditions of no greater than 40° C. At least a portion of the light emitting assembly is touch sensitive to provide control of the device. In a number of embodiments, the device emits greater than 50 lumens of light at maximum illumination, greater than 100 lumens of light at maximum illumination or even greater than 150 lumens of light at maximum illumination.

In a number of embodiments, temperature variance across the area of the at least one light panel is no greater than +/−5° C. A maximum surface temperature of the light emitting assembly during illumination in ambient conditions may, for example, be no greater than 40° C.

In a number of embodiments, at least a portion of an active area of the at least one light panel is touch sensitive. Touch sensitivity may additionally or alternatively be provided on a non-emissive area of the light emitting assembly. Touch sensitivity may, for example, be provided by sensing a change in resistance, by sensing a change in an acoustic wave, by sensing a change in capacitance, by sensing a disruption of infrared light, by sensing piezoelectricity or by sensing an acoustic pulse, or by sensing pressure to the panel. Touch sensitivity may, for example, include on/off control, dimming or brightness control, color control and/or color temperature control.

The light emitting assembly may further include a bezel encompassing the at least one light panel. In a number of embodiments, the bezel is no greater than 5 mm in width, no greater than 3 mm in width, no greater than 1 mm in width or no greater than 0.1 mm in width. In a number of embodiments, an overall maximum thickness of the light emitting assembly of the device is no greater than 5 mm.

In a number of embodiments, light emitted by the at least one light panel includes no greater than 1% light having a peak wavelength less than 440 nm. The at least one light panel may, for example, be flexible. The at least one light panel may, for example, be transparent.

A luminaire emissive utilization of the light emitting assembly may, for example, be greater than 50%, greater than 60%, greater than 75%, greater than 85% or even greater than 90%.

In another aspect, a method of providing personal lighting includes providing a device including a light emitting assembly having at least one light panel including one or more phosphorescent organic light emitting devices, the at least one light panel having a peak luminance less than 5,000 $cd/m^2$, an efficiency of greater than 30 lm/W, and a maximum surface temperature during illumination in ambient conditions of no greater than 40° C., and providing a touch sensitive surface on the light emitting assembly to provide control of the device. The device may, for example, emit greater than 50 lumens of light during illumination, greater than 100 lumens of light during illumination or even greater than 150 lumens of light during illumination.

In a number of embodiments, at least a portion of an active area of the at least one light panel is touch sensitive. Touch sensitivity may additionally or alternatively be provided on a non-emissive area of the light emitting assembly. Touch sensitivity may, for example, be provided by sensing a change in resistance, by sensing a change in an acoustic wave, by sensing a change in capacitance, by sensing a disruption of infrared light, by sensing piezoelectricity or by sensing an acoustic pulse, or by sensing pressure to the panel. Touch sensitivity may, for example, include on/off control, dimming or brightness control, color control and/or color temperature control.

In a further aspect, a method of fabricating a device including a light emitting assembly includes forming at least one light panel including disposing a plurality of phosphorescent organic light emitting devices upon a substrate, the at least one light panel having a peak luminance less than 5,000 $cd/m^2$, an efficiency of greater than 30 lm/W, and a maximum surface temperature during illumination in ambient conditions of no greater than 40° C., assembling the at least one light panel into the light emitting assembly of the device, and providing a touch sensitive surface on the light emitting assembly to provide control of the device. The device may, for example, emit greater than 50 lumens of light during illumination, greater than 100 lumens of light during illumination or even greater than 150 lumens of light during illumination.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

BRIEF DESCRIPTION OF THE SEVERAL VIEWS OF THE DRAWINGS

FIG. 5A illustrates a front view of a light emitting device hereof including the light emitting assembly of FIG. 3.

FIG. 5B illustrates a side view of the light emitting device of FIG. 5A.

FIG. 5C illustrates a perspective view of the light emitting assembly of FIG. 3 and a projection of the active areas and non-emissive areas thereof upon a plane for the purpose of determining a luminaire emission utilization.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
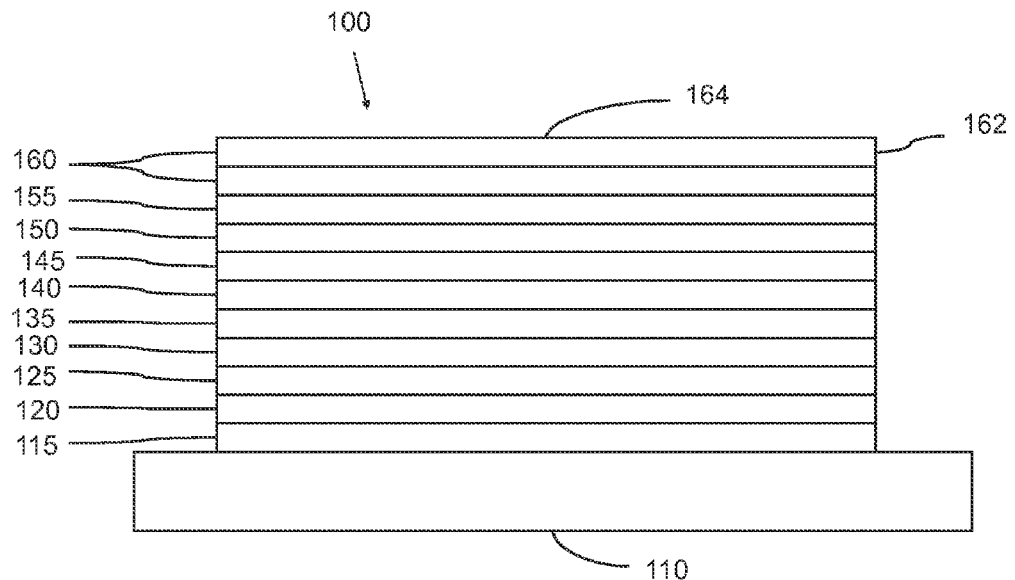
FIG. 1 illustrates schematically an embodiment of organic light emitting device.

FIG. 1 illustrates an embodiment organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
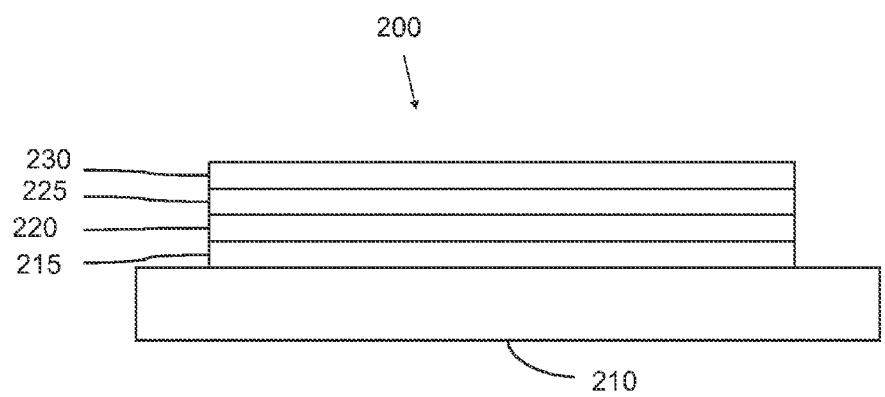
FIG. 2 illustrates schematically an embodiment of an inverted organic light emitting device that does not have a separate electron transport layer.

FIG. 2 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments hereof may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, 3-D displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.), but could be used outside this temperature range (for example, from −40 degrees C. to +80 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a light panel" includes a plurality of such light panels and equivalents thereof known to those skilled in the art, and so forth, and reference to "the light panel" is a reference to one or more such light panels and equivalents thereof known to those skilled in the art, and so forth.

In a number of embodiments hereof, OLED light sources are provided as lighting devices, lamp devices or luminaire devices. For example, such light sources may be used as personal lighting devices. As used herein, the phrase "personal lighting devices" refers generally to light sources for use in close proximity to a person. For example, the lighting devices may be used within an arm's reach (typically, less than 1 meter). Personal light devices are also preferably not bulky and may readily be moved to provide light where it is desired, thereby efficiently using the light emitted by the device while reducing or minimizing wasted light. There is great interest and need for high quality personal lighting devices that emit sufficient light to be useful, while not providing glare or becoming excessively hot (so that such device can be easily touched without harming the user).

Figure 3:
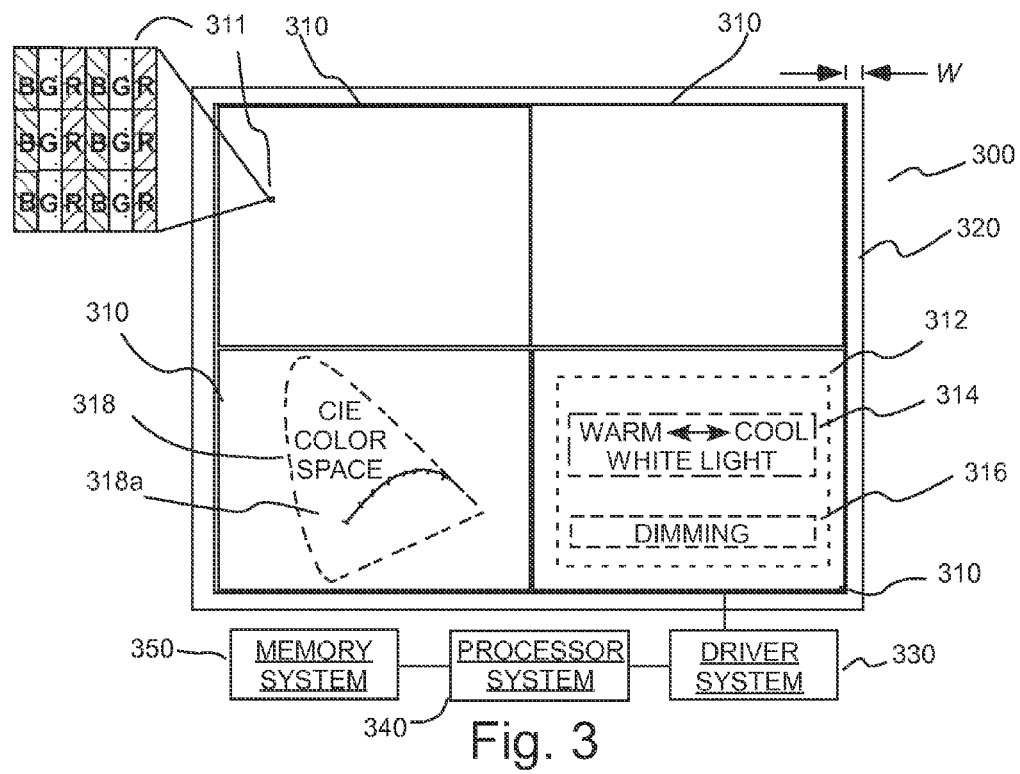
FIG. 3 illustrates schematically an embodiment of a light emitting assembly hereof including four light emitting panels and touch sensitivity to adjust color, color temperature and light output/dimming.

FIG. 3 illustrates an embodiment of a light emitting assembly 300 hereof which includes a plurality (four in the illustrated embodiment) of OLED/PHOLED light panels 310. The term "light emitting assembly" is used herein to refer to that portion of a lighting device or system upon which the one or more OLED panels of the lighting device are supported. The light emitting assembly includes, for example, the one or more OLED panels, any surrounding bezel(s) and any surrounding frame areas. As used herein, the term "OLED lighting panel" refers to a panel used for general illumination purposes, in contrast, for example, to an OLED display panel. There may be a number differences between OLED lighting panels and display panels. Display panels are used to display images. As a result, smaller devices corresponding to the pixels of the display panel are generally desirable to achieve higher resolutions, and it is also desirable to have pixels with a relatively low aspect ratio so that both vertical and horizontal resolution may be obtained. Also, in a display panel, it is generally desired to independently control the on-off state and intensity of each pixel. In a lighting panel, larger devices are generally desirable to achieve higher fill factors and high total light output, and it may be less desirable in some circumstances to independently control whether different devices are on or off. A lighting panel may be made to have a fixed color, or be color tunable by having pixels of different colors. In a lighting device it may be desirable to control all pixels of the same color to be at the same luminance. Also, for many uses of a lighting panel, a high Color Rendering Index (CRI) is desirable, while CRI is a lesser consideration in a display panel. CRI is generally reported in terms of general CRI, which is usually denoted by Ra. Conversely, achieving specific CIE coordinates is desirable for the different color devices of a full color display, whereas specific CIE coordinates may be lesser consideration for a lighting panel. The color of a white lighting panel is usually defined by its correlated color temperature.

As clear to those skilled in the art, fewer than four OLED light panels 310 in light emitting assemblies hereof may be used (including, for example, a single OLED light panel) and greater than four OLED light panels 310 may be used. OLED light panels typically include a plurality of sub-pixels disposed upon a substrate. Alternatively, OLED light panels may also comprise only one lighting device. OLEDs may, for example, create white light by combining differently colored (for example, red, green, and blue) sub-pixels as known in the art in a side-by-side or stacked arrangement. Single emitting white OLED panels or monochrome colored OLED panels may also be used herein. FIG. 3 illustrates a representative example of an area 312 of an OLED light panel 310 in which a red, green blue or RGB stripe sub-pixel pattern is formed. Once again, RGB subpixels may alternatively be stacked in a vertical arrangement. As known to those skilled in the art, an OLED panel may, for example, include one, tens, hundreds, thousands or more pixels. Associated electronic circuitry may be present to individually drive a group of sub-pixels which emit the same color.

In that regard, a driver system 330 (including, for example, one or more drivers) may be in operative connection with panels 310. Driver system 330 may, for example, be in communicative connection with a processor system 340 (including, for example, one or more microprocessors) and an associated memory system 350 (including, for example, one or more memory devices).

FIGS. 5A and 5B illustrate light emitting assembly 300 incorporated within a representative embodiment of a personal lighting device 500. Lighting device 500 includes a connector mechanism 510 in operative connection with light emitting assembly 300. Connection mechanism 510 may, for example, provide adjustability so that an orientation of light emitting assembly 300 be altered. Lighting device 500 may, for example, be powered by one or more batteries (which may, for example, be rechargeable) or via an available power grid or other power supply. The lighting device 500 may also be powered wirelessly. Wireless control system may, for example, be integrated in the driver system 330.

In FIGS. 5A and 5B, flat or planar light emitting assembly 300 is illustrated in a position orthogonal to a vertically oriented plane for ease of reference for certain features thereof. As described above, the orientation of light emitting assembly 300 may be changed via connector mechanism 510, which may, for example, provide for rotation of light emitting assembly 300 about its longitudinal and/or latitudinal axes. Connector mechanism 510 is attached to an extending support 520, which may also be adjustable in conformation or orientation to change the position or orientation of light emitting assembly 300. Extending support 520 is operatively connected to a base 530.

Figure 6A:
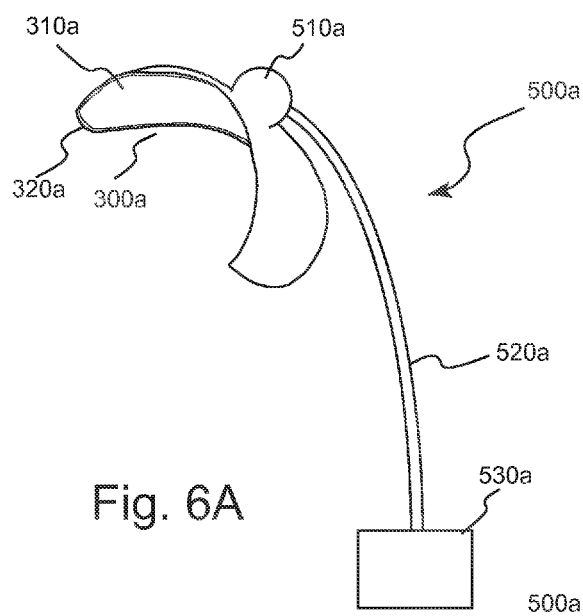
FIG. 6A illustrates a perspective view of a light emitting device including a curved or arced light emitting assembly.

Because OLED panels such as OLED panels 310 may, for example, be formed on a flexible substrate as described above, light emitting assemblies are readily formed in virtually any arced, curved or curvilinear profile. FIG. 6A, for example, illustrates a personal light emitting device 500a including a curved or arced light emitting assembly 300a including a single curved or arced OLED light panel 310a. In general, light emitting device 500a is similar in construction and operation to light emitting device 500 and components thereof are numbered similarly to like components of light emitting device 500 with the addition of the designation "a" thereto. Moreover, light emitting assembly 300a may be flexible so that the user may change the conformation thereof. Additionally, OLED light panels 310 or 310a may be transparent so that at least a portion of light emitting assembly 300 or light emitting assembly 300a, respectively may be transparent when in a non-emitting or "off" state.

Figure 7A:
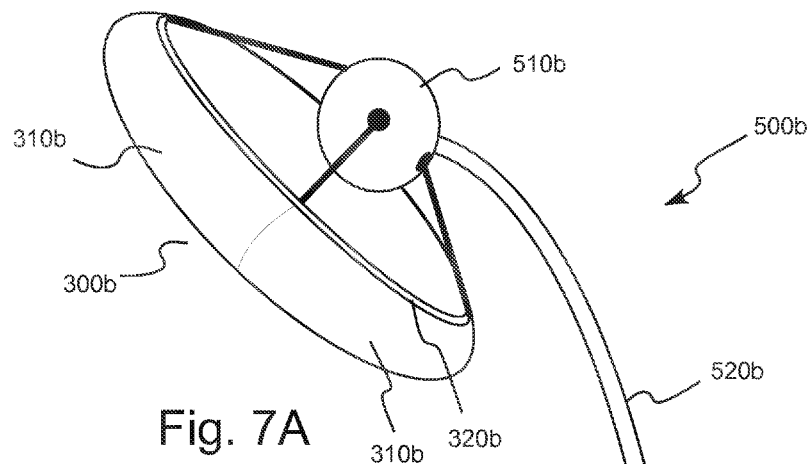
FIG. 7A illustrates a perspective view of another light emitting device including a curved or arced light emitting assembly.

FIG. 7A illustrates another embodiment of a personal light emitting device 500b including a curved or arced light emitting assembly 300b. Light emitting assembly 300b includes, for example two curved or arced OLED light panels 310b. In general, light emitting device 500b is similar in construction and operation to light emitting device 500 and components thereof are numbered similarly to like components of light emitting device 500 with the addition of the designation "b" thereto. An embodiment as illustrated in FIG. 7A may be beneficial in that any bezel, frame and portions panel borders abutting the bezel (that is, non-emissive areas outside the active area of the panels, which, in the curved embodiment of FIG. 7A, are facing the rear of light emitting assembly 300b) are eliminated in the calculation of the luminaire emissive utilization as described below.

Using OLEDs and, particularly, phosphorescent organic electronic light emitting devices or PHOLEDs lighting device hereof may be made to, for example, minimize or eliminate glare. As used herein, the terms, "phosphorescent organic electronic light emitting devices" or "PHOLEDs" refer to organic light emitting devices that include organic phosphorescent emitting materials as light sources. In a number of embodiments hereof, it is desirable to have as much of the light as possible generated from phosphorescent emitting materials, particularly for warm white light. In some embodiments, all photons emitted by the OLED(s) are of electronic light emitting device hereof may be emitted by organic phosphorescent emitting materials. In embodiments in which cool white light (typically having a color temperature over 5000 K) are to be emitted by OLED light panels hereof, it may be desirable to use fluorescent blue emitting materials to increase lifetime.

Glare may, for example, be referenced as difficulty in viewing an object in the presence of a bright light source, and may be caused by a significant ratio of luminance between the object being viewed and the glare source. The human eye can function from very dark to very bright levels of light. Its sensing capabilities reach across nine orders of magnitude. However, in any given moment of time, the eye can only sense a contrast ratio of approximately 1000. Thus, a high luminance device or luminaire would reduce the ability of human eyes to see certain objects at low luminance. Additionally, glare can cause discomfort, resulting in an instinctive desire to look away from a bright light source (sometimes referred to as discomfort glare). Glare can also cause disability (sometime referred to as disability glare). Furthermore, the spectrum property of the light sources also has an impact on glare. Light at short wavelength causes glare more easily.

The root cause of glare in most lighting devices is that the light sources in such lighting devices are point light sources. In that regard, the light is generated in a relatively small volume with extremely high intensity. Distributing the light poses a huge challenge, often requiring complicated optics which significantly reduce the efficacy of those devices and increase the cost thereof. As a result, existing light devices exhibit a high contrast and a high peak luminance level.

Unlike conventional light sources, an OLED is a planar, diffused light source. OLED panels may, for example, exhibit a relatively high luminance uniformity. For example, an OLED panel may exhibit a luminance uniformity of 85%, which corresponds to a contrast ratio or CR (defined as the maximum or peak luminance/minimum luminance) of 1.18. Optimization of panel design to achieve such high uniformity and low contrast ratios is, for example, described in U.S. Patent Application Publication No. 2012/0286298, the disclosure of which is incorporated herein by reference. To reduce or eliminate glare in a number of embodiments hereof, the peak luminance of OLED light panels hereof is less than 5,000 cd/m$^2$. While maintaining a peak luminance of light panels 310 less than 5,000 cd/m$^2$, OLED panels hereof can provide a luminous emittance of, for example, up to 10,000-15,000 lm/m$^2$ before they exhibit glare. As used herein, luminous emittance (lm/m$^2$) refers to the total number of lumens emitted by an OLED panel divided by the panel area, wherein the panel area is the area of a surface defined by the outline of the active emissive area, and includes both active emissive area and the areas in between. The panel area may be smaller than the substrate area, which includes non-emissive areas around the edges of the panel that may be needed for encapsulation, electrical connections, mechanical mounting etc. A luminous emittance of 15,000 lm/m$^2$ indicates that even a 10 cm×10 cm lamp will provide 150 lumens without exhibiting glare. In a number of embodiments, the light emitting assemblies hereof emit greater than 50, greater than 100 or even greater than 150 lumens of light at maximum illumination. Virtually all other type of currently available lamps require bulky diffusers etc. to provide such a level of lighting without significant glare. Thus, OLEDs, and particularly PHOLEDs, are well-suited for use in a personal lighting device.

As described above, light at short wavelength more easily causes glare. In a number of embodiments hereof, OLED light panels hereof are capable of limiting the amount of light emitted at short wavelength. In a number of embodiments, light emitted by the at least one light panel includes no greater than 1% light having a peak wavelength less than 440 nm.

In a number of embodiments, light emitting assemblies hereof, such as light emitting assembly 300, are designed to maximize a luminaire emission utilization thereof to facilitate reduction of peak illuminance. As used herein, the term "luminaire emission utilization" refers to the ratio between the maximum projected emissive area or active area of the light emitting assembly and the associated clearance area or total projected area of the light emitting assembly. As used herein, the "active area" of an OLED light panel refers to the emissive area of the panel (that is, the portion of the OLED panel that emits light). The active area of an OLED panel thus generally refers to the area defined within the outline or perimeter of the OLED subpixel pattern thereof, minus any area within this region that does not emit light As the active areas of the light emitting assemblies hereof arise from the OLED light panel(s) of the light emitting assemblies, the active area of the light emitting assemblies is the total of the active areas of the OLED light panels thereof.

Because of the many variations in design or form factor for personal lighting devices, it may be difficult to determine the position at which a light emitting assembly as defined herein transitions, for example, to a support or base therefor. For this reason, in determining the total projected area of the light emitting assembly for calculating luminaire emission utilization, the projected area of the light emitting assembly will be considered to end at a distance no greater than 1 inch from the outline or perimeter of the active area of the light emitting assembly.

The concept of luminaire emission utilization may, for example, be better understood with reference to FIG. 5C wherein the projected emissive area or active area of light emitting assembly 300 and the total projected area (or clearance area) of the light emitting assembly on a plane P is illustrated. The orientation of the light emitting assembly 300 relative to plane P is chosen such that the projected active area is maximized. In the case of a planar OLED light panels 310, the projected active area is maximized when light emitting assembly 300 and light panels 310 thereof are oriented parallel to plane P. The surface areas of each of the active areas and non-active or non-emissive areas are projected as if a columnar source of light was emanating therefrom in a direction orthogonal to the plane (see dashed arrows in FIG. 5C). The areas that reduce luminaire emission utilization include non-emissive areas such as bezels, packaging areas, non-emissive panel areas, frame areas and so on. Projected non-emissive areas are illustrated with dark lines and dots in FIG. 5C, which may be exaggerated for visualization. As set forth above, the luminaire emission utilization is calculated by dividing the projected active area by the total projected area of light emitting assembly 300.

Figure 6B:
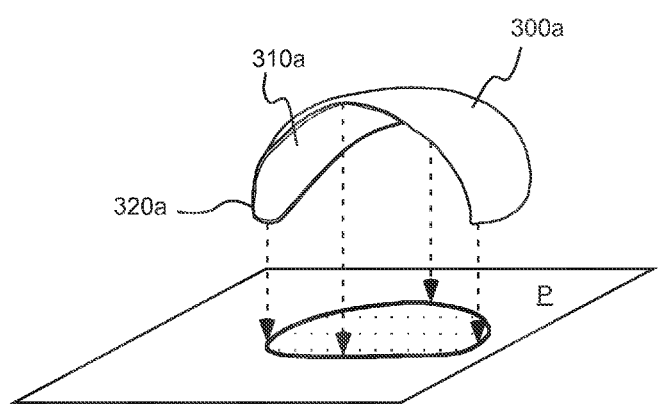
FIG. 6B illustrates a perspective view of the light emitting assembly of the light emitting device of FIG. 6A and a projection of the active areas and non-emissive areas of the light emitting assembly upon a plane for the purpose of determining a luminaire emission utilization.
Figure 7B:
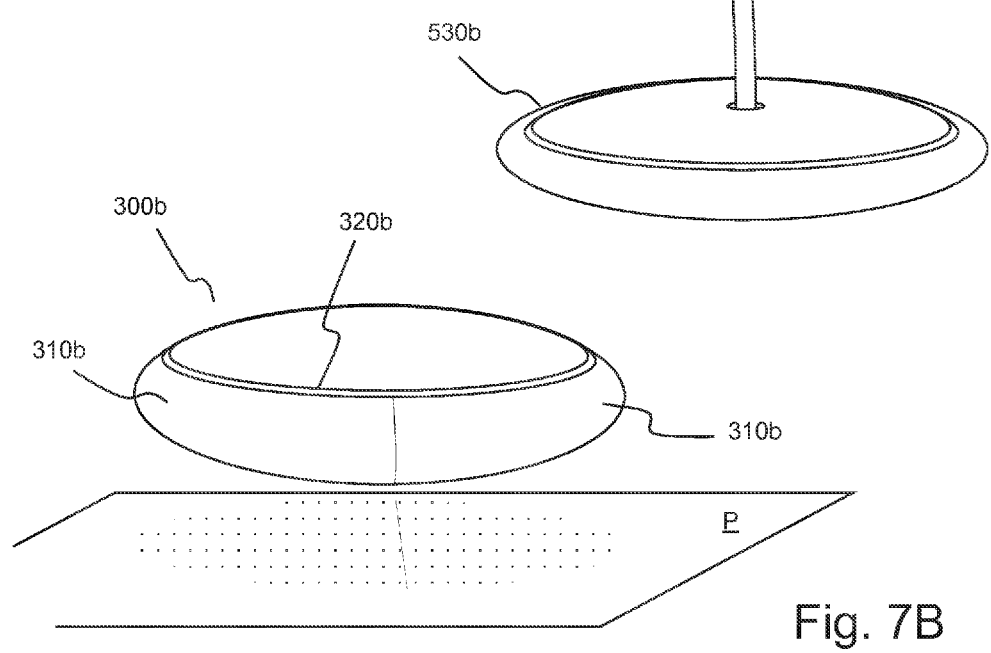
FIG. 7B illustrates a perspective view of the light emitting assembly of the light emitting device of FIG. 7A and a projection of the active areas and non-emissive areas of the light emitting assembly upon a plane for the purpose of determining a luminaire emission utilization.

FIG. 6B illustrates the projected emissive area or active area of light emitting assembly 300a and the total projected area of light emitting assembly 300a on a plane P. The orientation of the light emitting assembly 300a relative to plane P is once again chosen such that the projected active area is maximized. Similarly, FIG. 7B illustrates the projected active area of light emitting assembly 300b and the total projected area of light emitting assembly 300b on a plane P. As described above, the orientation of the light emitting assembly 300b relative to plane P is chosen such that the projected active area is maximized.

A number of design parameters may, for example, be optimized to maximize luminaire emission utilization. For example, OLED light panels 310 may be designed to have a relatively high percentage of emissive areas or active areas. In that regard, light emitting panels 310 may be fabricated to have a high fill factor (FF), which assists in reducing the peak luminance. The term "fill factor" as used herein refers to the ratio between the emissive surface area or active area of the OLED panel and the total surface area of the light emitting panel.

Various design approaches and optimization techniques may, for example, be used to maximize the fill factor. Some of the approaches may include, but are not limited to: optimizing panel layout design where narrower and/or less non-emissive metal bus lines are integrated; reducing border and bezel regions on the panel by applying thin film encapsulation; employing novel device structure where emissive bus lines are incorporated; engineering and/or matching sheet resistances of electrodes such that bus lines may be completely eliminated; increasing the thickness of bus lines while reducing the width of bus lines; using highly conductive metal, such as silver or copper, as bus lines; minimizing the coverage of insulator over metal bus lines; using stacked OLED structure to reduce current density and therefore to reduce the amount of bus lines; applying external wires outside active area to assist current distribution without impacting fill factor; and the combination of thereupon. Such techniques are, for example, discussed in U.S. Patent Application Publication No. 2012-0286298, U.S. patent application Ser. No. 13/422,924; filed Mar. 16, 2012, U.S. patent application Ser. No. 13/547,985; filed Jul. 12, 2012, U.S. Patent Application Publication No. 2012-0286651 and U.S. patent application Ser. No. 13/173,072, the disclosures of which are incorporated herein by reference.

OLED light panels may, for example, have borders of limited width or be "borderless" OLED light panels wherein there is little to virtually no gap between a substrate edge and the OLED active area. Borderless OLED displays are, for example, described in U.S. patent application Ser. Nos. 13/422,924 and 13/547,985, and U.S. Pat. Nos. 7,304,634, 6,885,157, 7,814,652 and 6,620,731 As used herein, the terms "border", "inactive border area", "inactive edge area" or like terms refer to area around the active area of the OLED panel that is not emissive (that is, the portion of the OLED panel around the active area from which no light is emitted).

"Borderless" OLED light panels are facilitate by encapsulation with such thin-film barrier layer encapsulation. As used herein, a "barrier film" or "barrier layer" refers to a layer of material that may be utilized to decrease the permeation of gases, vapors, and/or moisture (or other environmental particulates) into the active device area of the device so as to increase lifetime and/or reduce performance degradation. As described above, in a number of embodiments, the barrier film may comprise a hybrid layer comprising a mixture of a polymeric material and a non-polymeric material. As used herein, the term "non-polymeric" refers to a material made of molecules having a well-defined chemical formula with a single, well-defined molecular weight. A "nonpolymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. For example, in some embodiments, the barrier film may comprise a mixture of polymeric silicon and inorganic silicon. Examples of barrier films are described in more detail in U.S. Pat. No. 7,968,146 and PCT Patent Application Nos. PCT/US2007/023098 and PCT/US2009/042829.

As described above, a preferred barrier layer includes a mixture of a polymeric material and a non-polymeric material. In a number of embodiments, a barrier film is deposited in a thin film deposition technique such as vapor deposition using an organosilicon precursor. The barrier film may, for example, consist essentially of a mixture of polymeric silicon and inorganic silicon. In a number of embodiments, the weight ratio of polymeric silicon to inorganic silicon may be in the range of 95:5 to 5:95. The polymeric silicon and the inorganic silicon may, for example, be created from the same precursor material. In a number of embodiments, at least a 0.1 nm thickness of the barrier film may be deposited under the same reaction conditions for all the reaction conditions in the deposition process. In a number of embodiments, the water vapor transmission rate provided by the barrier film may be less than $10^{-6}$ g/m$^2$/day through the at least 0.1 nm thickness of the barrier film.

Figure 4:
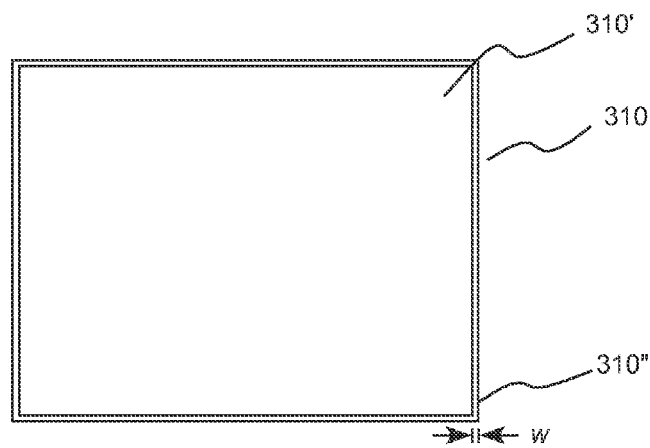
FIG. 4 illustrate an OLED light panel of the light emitting assembly of FIG. 3.

In a number of embodiments hereof, the maximum width of any inactive edge area or inactive border area (see, for example, width w of inactive border area 310" surrounding active area 310' in FIG. 4) of an OLED panel may, for example, be no more than 3 mm, no more than 2 mm, no more than 1 mm, or even no more than 0.1 mm. Although the outline or perimeter of active area 310' (see FIG. 4) of OLED panel 310 is rectangular in shape, the active areas may, for example, be irregular, curved or curvilinear in shape. Regardless of the shape of the active area, the specifications for the maximum width of any associated inactive border area are applicable.

As known in the art, a bezel 320 may be used to surround the light emitting OLED panel or panels 310 of light emitting assembly 300. OLED-based light emitting assemblies 300 are well-suited to having narrow bezels, so that the light emitting or active area (as defined by panel(s) 310) can be positioned very close to the edge of light emitting assembly 300. Bezel 320 may, for example, have a width W of no greater than 5 mm, no greater than 3 mm, no greater than 1 mm or no greater than 0.1 mm.

In a number of embodiments, the total active area of the light emitting panel(s) of light devices hereof is in the range of 6.5 cm$^2$ to 950 cm$^2$. However, smaller as well as larger total active areas are readily provided. Light emitting assemblies for device hereof may be relatively thin and not bulky in appearance. In a number of embodiments, the light emitting assemblies hereof have a maximum depth or thickness of no greater than 5 mm (see, for example, dimension T in FIG. 5B).

In addition to exhibiting glare, currently available personal lighting devices, luminaires or lamps with reasonably useful light output become hot in operation. Such characteristics are very undesirable in a personal lighting device, lamp or luminaire. The lighting devices hereof can emit greater than 50 lumen, greater than 100 lumens, or greater than 150 lumens, while being placed close to a person, and without generating excessive glare or heat.

Figure 8:
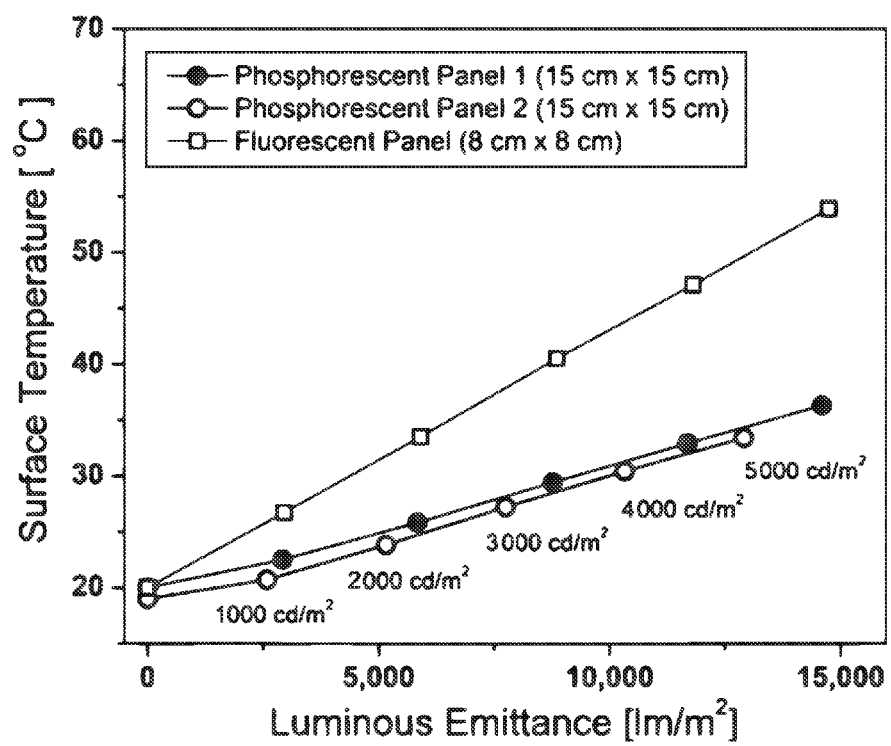
FIG. 8 illustrates a plot of surface temperature versus luminous emittance for two phosphorescent organic electronic light emitting device panels and a fluorescent organic light emitting device panel.

In that regard, OLED lighting may, for example, be made to be efficient using, for example, PHOLED technology, so that it can provide a good level of illumination as described above without the panels becoming too hot to touch. Highly efficient OLED light panels including PHOLEDs are, for example, described in PCT International Patent Application Publication No. WO 2011/146734, the disclosure of which is incorporate herein by reference. By using phosphorescent OLED technology with high internal quantum efficiency, heating from non-radiative decay of exciton states can be almost entirely removed. The internal quantum efficiency of all phosphorescent devices may, for example, be at least 70%, at least 90%, and most preferably about 100%. 100% is the top of any range for internal quantum efficiency. The use of high internal quantum efficiency phosphorescent OLEDs enables lower temperatures than for equivalent fluorescent OLED panels (see, for example, FIG. 8), which inherently generate a significant amount of heat as a result of the presence of excitons that cannot emit light, and that decay via other mechanisms that generally involve the generation of heat. Furthermore, lower current required to drive a PHOLED lighting panel reduces $I^2R$ power loss and associated heat generation in distributing current throughout the light emitting panel area.

The one or more OLED light panels of lighting devices hereof may, for example, exhibit a maximum surface temperature during illumination in ambient conditions (that is, 20 to 25° C.) of no greater than 40° C. or no greater than 35° C. Additionally, OLED light panels hereof may be made to be thermally very uniform. Unlike, for example, LED panels, OLED panels do not have hot LEDs placed around a panel edge. The temperature variance across an area of OLED light panels hereof may, for example, be no greater than +/−5° C. The low operational temperature and uniform thermal distribution also benefits the device lifetime and prevent differential aging.

Phosphorescent OLEDs having internal quantum efficiency as described above are known to the art and may be readily achieved. Examples from the literature include devices disclosed in the following references:

Schwartz, G. et al., Triple Harvesting in Hybrid White Organic Light-Emitting Diodes, Adv. Fun ct. Mater. (2009) 19, 1319-1333.

Reineke, S. et al., White Organic Light-Emitting Diodes with Fluorescent Tube Efficiency, Nature (14 May 2009) 459, 234-239.

Xiao, L. et al., Nearly 100% Internal Quantum Efficiency in an Organic Blue-Light Electrophosphorescent Device Using a Weak Electron Transporting Material with a Wide Energy Gap, Adv. Mater. (2009) 21, 1271-1274.

Williams, Evan et al., Excimer-Based White Phosphorescent Organic Light Emitting Diodes with Nearly 100% Internal Quantum Efficiency, Adv. Mater. (2007) 19, 197-202.

Wang, Q. et al., Harvesting Excitons Via Two Parallel Channels for Efficient White Organic LEDs with Nearly 100% Internal Quantum Efficiency: Fabrication and Emission-Mechanism Analysis, Adv. Funct. Mater. (2009) 19, 84-95.

Jeon, S. et al, Theoretical maximum quantum Efficiency in Red Phosphorescent Organic Light-Emitting Diodes at a Low Doping concentration Using a Spirobenzojluorene Type Triplet Host Material, Organic Electronics (2010) 11, 881-886.

Sun, Y. et al., Management of Singlet and Triplet Excitons for Efficient White Organic Light Emitting Devices, Nature (13 Apr. 2006) 440, 908-912.

Baldo, M. et al., Highly Efficient Phosphorescent Emission From Organic Electroluminescent Devices, Nature (10 Sep. 1998) 395, 151-154.

Sun, Y. et al., Multiple Exciton Generation regions in Phosphorescent White Organic Light Emitting Devices, Organic Electronics (2008) 9, 994-1001.

Jeon, W. et al, Low Roll-Off Efficiency Green Phosphorescent Organic Light-Emitting Devices with Simple Double Emissive Layer Structure, Applied Physics Letters (2008) 93, 063303-1-063303-3.

Many of these references describe a combination of the desired internal quantum efficiency with a device having a desirably high CRI.

In addition to preventing burning upon touch, relatively low operating temperatures enable at least a portion of the light emitting assemblies hereof to be touch sensitive to provide control of the lighting device. Touch sensitivity may, for example, be provided via any number of touch sensitive technologies known in the art including, but not limited to, by sensing a change in resistance, by sensing a change in an acoustic wave, by sensing a change in capacitance, by sensing a disruption of infrared light, by sensing piezoelectricity, by sensing an acoustic pulse, or by sensing pressure to the panel.

One or more of OLED light panels of the light emitting assemblies hereof may, for example, include one or more touch sensitive portions or sections. Such a touch sensitive section may, for example, extend across multiple OLED light panels. FIG. 3 illustrates a number of representative touch sensitive sections on OLED light panels 310. For example, touch sensitivity may be provided over the entire area of OLED light panels for on/off control of, for example, lighting device 300. FIG. 3 also illustrates a section 312 in which a touch sensitive section 314 is provided to tune color temperature (for example, on the spectrum warm to cool white light). A touch sensitive section 316 is also provided to control dimming (that is, to increase or decrease the total light output from light emitting assembly 300). Another section 318 is illustrated wherein at least a portion of the CIE color space is represented to provide, for example, for output other than white light. The black body locus or path is represented by line 318a in section 318.

Touch control may, for example, include simple binary on/off control as described above. There are many schemes by which touch control other than simple binary on/off control may be provided. For example, an area of an OLED light panel or panels may be marked with a line, shape or scale as described above in connection with FIG. 3 to provide control of, for example, color, temperature, brightness etc. The line, shape or scale may be set forth on the panel via gradations marked on the top of the panel(s), marked below the panel(s) or displayed on the panel(s) by operating the panel(s) in a turn-on mode. Alternatively, such a line, shape or scale may be provided on a bezel or frame area adjacent one or more panels. The number of times a panel is touched or the duration of one or more touches may also be used to control devices hereof.

Although, touch sensitivity is represented on OLED light panels 310 in FIG. 3, touch sensitivity can additionally or alternatively be provided on the sides, rear or any other portion of light emitting assembly 300. The temperature of the entire surface of light emitting assemblies hereof remains relatively low during illumination. In that regard, a maximum surface temperature of any surface of light emitting assemblies hereof during illumination in ambient conditions (that is, 20 to 25° C.) may be no greater than 40° C. or no greater than 35° C.

As described above, each OLED light panel may include at least two groups of OLED elements that emit light with different peak wavelengths. Each OLED element may, for example, include an OLED. Each OLED element may also, for example, includes fault tolerant structure as, for example, described in U.S. Patent Application Publication No. 2012-0181933 and U.S. patent application Ser. No. 13/590,081, the disclosures of which are incorporated herein by reference. The lighting device may, for example, include a single driver that electrically splits into at least two sub-drivers to operate each group of OLED elements emitting light of different peak wavelengths. Alternatively, the lighting system may include at least two individual drivers to operate each group. The OLED elements from one group may, for example, all be connected in parallel and operated by one driver, or one sub-driver. Each group is driven separately, controlled by its own driver, or sub-driver to control the color or color temperature of light emitted by the OLED light panels hereof.

OLED-based light emitting devices hereof may be used to provide superior personal illumination than possible with previous technologies. The light emitting devices hereof may, for example, be placed closer to a person than conventional lighting, providing a higher application efficiency and more intimate and pleasing illumination. OLED light panels provide a diffuse source of light with high light quality, reproducing well the solar spectrum. Moreover, relatively low operational temperature of light emitting assemblies hereof enables safe touching (either unintentional or intentional—for example, to control the lighting device). OLED panels and light emitting assemblies including such panels may, for example, be made to be relatively thin and lightweight, while providing all the features set forth above. Such design features provide a significant increase in design freedom and user friendliness as compared to currently available personal lighting devices.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A device, comprising:
a light emitting assembly comprising at least one light panel comprising one or more phosphorescent organic light emitting devices, the at least one light panel having a peak luminance greater than substantially 1000 cd/m$^2$ and less than substantially 5,000 cd/m$^2$, an efficiency of greater than 30 lm/W, and a maximum surface temperature during illumination in ambient conditions of no greater than 40° C., wherein at least a portion of an active area of the at least one light panel is touch sensitive to provide control of the device,
wherein the portion of the active area that is touch sensitive includes a first section to control a color temperature of at least one light panel of the light emitting assembly and a second section to control dimming of at least one light panel of the light emitting assembly, wherein another portion of the active area of the at least one light panel displays a color space of the light emitting assembly.

2. The device of claim 1 wherein touch sensitivity is provided by sensing a change in resistance, by sensing a change in an acoustic wave, by sensing a change in capacitance, by sensing a disruption of infrared light, by sensing piezoelectricity or by sensing an acoustic pulse, or by sensing pressure to the panel.

3. The device of claim 1 wherein at least a portion of a surface of the light emitting assembly from which light is not emitted is touch sensitive.

4. The device of claim 1 wherein a temperature variance across an area of the at least one light panel is no greater than +/−5° C.

5. The device of claim 1 wherein control of the device via touch sensitivity includes on/off control.

6. The device of claim 1 wherein control of the device via touch sensitivity includes color control.

7. The device of claim 1 wherein the light emitting assembly further comprises a bezel encompassing the at least one light panel, wherein the bezel is no greater than 3 mm in width.

8. The device of claim 7 wherein the bezel is no greater than 1 mm in width.

9. The device of claim 1 wherein light emitted by the at least one light panel includes no greater than 1% light having a peak wavelength less than 440 nm.

10. The device of claim 1 wherein the device is a personal lighting device.

11. The device of claim 1 wherein the at least one light panel is flexible.

12. The device of claim 1 wherein the at least one light panel is transparent.

13. The device of claim 1 wherein a luminaire emissive utilization of the light emitting assembly is greater than 50%.

14. The device of claim 1 wherein a luminaire emissive utilization of the light emitting assembly is greater than 60%.

15. The device of claim 1 wherein a luminaire emissive utilization of the light emitting assembly is greater than 75%.

16. The device of claim 1 wherein a luminaire emissive utilization of the light emitting assembly is greater than 85%.

17. The device of claim 1 wherein a luminaire emissive utilization of the light emitting assembly is greater than 90%.

18. The device of claim 1 wherein an overall thickness of the light emitting assembly of the device is no greater than 5 mm.

19. The device of claim 1, wherein the device emits greater than 150 lumens of light during illumination.

20. The device of claim 1, wherein the device emits the peak luminance without glare.

21. The device of claim 1, wherein a third section controls a color temperature of at least one light panel of the light emitting assembly and a forth section controls total light output of at least one light panel of the light emitting assembly.

22. A method of providing personal lighting, comprising:
providing a device comprising a light emitting assembly comprising at least one light panel comprising one or more phosphorescent organic light emitting devices, the at least one light panel having a peak luminance greater than substantially 1000 cd/m$^2$ and less than substantially 5,000 cd/m$^2$, an efficiency of greater than 30 lm/W, and a maximum surface temperature during illumination in ambient conditions of no greater than 40° C.; and
providing a touch sensitive surface on at least a portion of an active area of the at least one light panel to provide control of the device,
wherein the portion of the active area that is touch sensitive includes a first section to control a color temperature of at least one light panel of the light emitting assembly and a second section to control dimming of at least one light panel of the light emitting assembly, wherein another portion of the active area of the at least one light panel displays a color space of the light emitting assembly.

23. The method of claim 22 wherein touch sensitivity is provided by sensing a change in resistance, by sensing a change in an acoustic wave, by sensing a change in capacitance, by sensing a disruption of infrared light, by sensing piezoelectricity or by sensing an acoustic pulse.

24. A method of fabricating a device comprising a light emitting assembly, comprising:
- forming at least one light panel comprising disposing a plurality of phosphorescent organic light emitting devices upon a substrate, the at least one light panel having a peak luminance greater than substantially 1000 $cd/m^2$ and less than substantially 5,000 $cd/m^2$, an efficiency of greater than 30 lm/W, and a maximum surface temperature during illumination in ambient conditions of no greater than 40° C.;
- assembling the at least one light panel into the light emitting assembly of the device, and
- providing a touch sensitive surface on at least a portion of an active area of the at least one light panel to provide control of the device,
- wherein the portion of the active area that is touch sensitive includes a first section to control a color temperature of at least one light panel of the light emitting assembly and a second section to control dimming of at least one light panel of the light emitting assembly, wherein another portion of the active area of the at least one light panel displays a color space of the light emitting assembly.

* * * * *